United States Patent [19]

Bader

[11] Patent Number: 4,665,461
[45] Date of Patent: May 12, 1987

[54] CIRCUIT FOR REDUCING ELECTROMAGNETIC INTERFERENCE FROM MAGNETIC CORE KEYBOARDS

[75] Inventor: Clifford J. Bader, West Chester, Pa.

[73] Assignee: Systems Development Corporation, Camarillo, Calif.

[21] Appl. No.: 836,758

[22] Filed: Mar. 6, 1986

[51] Int. Cl.$^4$ ............................................. H01H 47/00
[52] U.S. Cl. ............................... 361/159; 340/365 L; 84/DIG. 7; 400/479.2
[58] Field of Search .................. 84/DIG. 7; 361/159; 307/91; 340/365 L; 400/474, 479.2

[56] References Cited

U.S. PATENT DOCUMENTS

| | | | |
|---|---|---|---|
| 4,494,109 | 1/1985 | Bernin | 400/479.2 |
| 4,529,967 | 7/1985 | Gifft | 400/479.2 |

Primary Examiner—L. T. Hix
Assistant Examiner—David M. Gray
Attorney, Agent, or Firm—Mark T. Starr

[57] ABSTRACT

The present disclosure describes circuit variants for reducing electromagnetic interference from saturable core keyboards to acceptable levels. The invention finds particular application in conjunction with capacitive-discharge scan techniques used in such keyboards. In order to attenuate the external field resulting from such techniques, a circuit is taught which effectively disconnects the scan line array from the capacitor charging circuit during the time between scans. A second variant, when added to the first, further reduces interference by disconnecting the entire scan circuit from the supply potential during the scan time thereby eliminating steady-state currents and turnoff oscillatory transients.

11 Claims, 4 Drawing Figures

CIRCUIT FOR REDUCING ELECTROMAGNETIC INTERFERENCE FROM MAGNETIC CORE KEYBOARDS

BACKGROUND OF THE INVENTION

In the operation of electronic equipment, it is necessary to reduce EMI/RFI emissions to acceptable levels. The electronic keyboard used, for example, in computer workstations is an inherently difficult device to shield adequately against the emission of undesirable electromagnetic interference because of the keys themselves. Such keys represent mechanically moving components which by their very nature must protrude from the surface of the electronic component assemblies. Barring the use of an expensive and potentially unreliable flexible shield membrane, probably the best solution to the problem is to contain the electronics in a suitably shielded enclosure having appropriate-sized apertures for the keys. Such an arrangement adequately suppresses emissions from the elctronic circuits in general. However, any electric field existing between portions of the key assembly and the shielded enclosure will create an external electric field and a concomitant interference problem. External magnetic fields resulting from sizeable differential currents flowing in the key assembly may be effectively cancelled by judicious placement of incoming and outgoing circuit leads. Thus, the minimization of interference from the keyboard assembly principally involves the reduction of electrostatic effects.

The saturable-core keyboard to which the present invention is directed, utilizes the properties of a toroidal magnetic core in the presence of a permanent magnet attached to a key associated therewith. The core is wound with input and output windings. With the key in its non-actuated, undepressed state, the magnet is situated in close proximity to the core. Thus, the magnetic material of the core is saturated and its permeability is very low. Under this condition, transformer action is not present to any significant degree, and a signal applied to a primary winding on the core is either absent or greatly diminished on a secondary winding thereon. However, when a key is depressed, the magnet moves away from the core, permitting the permeability to rise to a high value and causing a large percentage of the primary signal to appear on the secondary winding. The presence of a signal at the approximate scan time is indicative of the actuation of a given key.

In a practical environment wherein small physical size and high speed operation are required, miniature ferrite toroidal cores and single turn winding loops for the respective primary and secondary windings are utilized. The rate of current rise to produce usable voltage signals from such an arrangement is rather high, for example, 1 ampere per microsecond. Also, the current rise must be sustained for a time sufficient to permit the secondary voltage pulse to be detected, that is, approximately 100 nanoseconds. In order to accomplish the foregoing, a relatively fast current driver capable of peak currents on the order of 100 milliamperes is required.

A current driver for use in the keyboard application can be implemented in a number of ways. However, those designs which offer a high degree of simplicity and low cost are preferred by manufacturers of keyboard equipment. Also, the driver design can have a profound effect on the emission of interference from the keyboard. In general, the use of standard driver integrated circuits is favored. The circuit configuration for such circuits involves the grounding of the emitter of the driving transistor to the circuit common, while the collector is coupled to the load. The drive current is limited only by the inherently high and variable transistor gain or by external parameters, such as the use of a limiting resistance or of a current source.

A present day simple and cost effective means of limiting the energy available while providing a high instantaneous current results from a capacitor discharge technique. In addition to energy limiting which protects the electronic components, the capacitor discharge scheme allows the use of a wide drive pulse and also permits the drive transistor to saturate, thereby damping any initial transient oscillations which might contribute to interference problems. A potential source of interference is present however, on termination of the input pulse. Moreover, to a first approximation, the voltage waveform existing between the scan conductors threaded through the ferrite cores and the circuit chassis, resembles a square wave pulse and is thus rich in the fundamental frequency and lower order harmonics. Also, since the pulse leading edge exhibits a very fast rise time, considerable energy also appears at the higher harmonics. The peak-to-peak amplitude of the pulse approximates the level of the supply voltage, so that the actual condition approaches the worst possible state that could exist under normal circumstances.

What is desired is a reduction in the energy available for interference due to the resultant field. In view of the foregoing statement of the nature of the interference, two courses of action may be pursued. The first involves a reduction in the width of the drive pulse; the second, reduction of the pulse amplitude. The former lowers the energy at the fundamental and lower order harmonics, but does not provide much attenuation of the higher order harmonics. The latter, on the other hand, affects all frequencies in equal fashion. The drive circuit modification of the present invention provides both of the above mentioned actions. It reduces interference to an acceptable level, while retaining the simplicity and cost effectiveness of the aforementioned integrated circuit drive and its capacitor discharge mode of operation.

SUMMARY OF THE INVENTION

In accordance with the present invention, there is provided a circuit modification which provides a reduction in the electromagnetic interference to an acceptable level. This modification involves the placement of a transistor stage between the capacitor/charging resistor junction and the scan line common point. The circuit arrangement is such that the last mentioned transistor conducts only when a scan drive pulse is present, and turns off at the termination of the latter pulse and the beginning of the capacitor recharge. Thus, the scan line array is effectively disconnected from the capacitor. The scan line remains near ground potential, except for inductive transients, and the charge of the capacitor to the level of the supply voltage does not affect the scan line potential.

The overall result of the circuit modification is that the voltage on the respective electrodes of the drive transistors to which the scan lines are connected reach a maximum voltage level identified with the electrode saturation during peak current operation and considerably less voltage during steady-state periods. Thus, voltage excursions at the keys are reduced to very nearly the minimum necessary to permit proper keyboard operation. As noted hereinbefore, such a reduction is effective in suppressing interference derived from all the frequencies present.

While the suppression provided by the foregoing circuit is adequate for most applictions, an additional reduction in interference is possible by interposing a second transistor stage between the capacitor and the voltage supply. Such a transistor operates to disconnect the entire scan circuit from the supply during the scan pulse period and there is no steady-state current flow. The latter condition eliminates a small oscillatory transient voltage which occurs when the steady-state current of the former circuit, utilizing a single additional transistor stage, is interrupted.

Finally, a logic circuit is described for providing normal and inverted drive pulses for operating the transistor stages responsible for the interference suppression. Such a circuit finds particular application where such pulses cannot be derived from the scan drive because of the inaccessibility of the latter.

Both of the suppression circuit variants as described hereinbefore, as well as the logic circuit where desirable, are ideally suited for retrofitting existing keyboards or for incorporation into an upgraded product design. The electromagnetic interference reduction provided by the present invention is such that only minimal, tolerable levels remain. Other features and advantages of the invention will become apparent in the detailed description which follows.

DESCRIPTION OF THE PREFERRED EMBODIMENT

Figure 1:
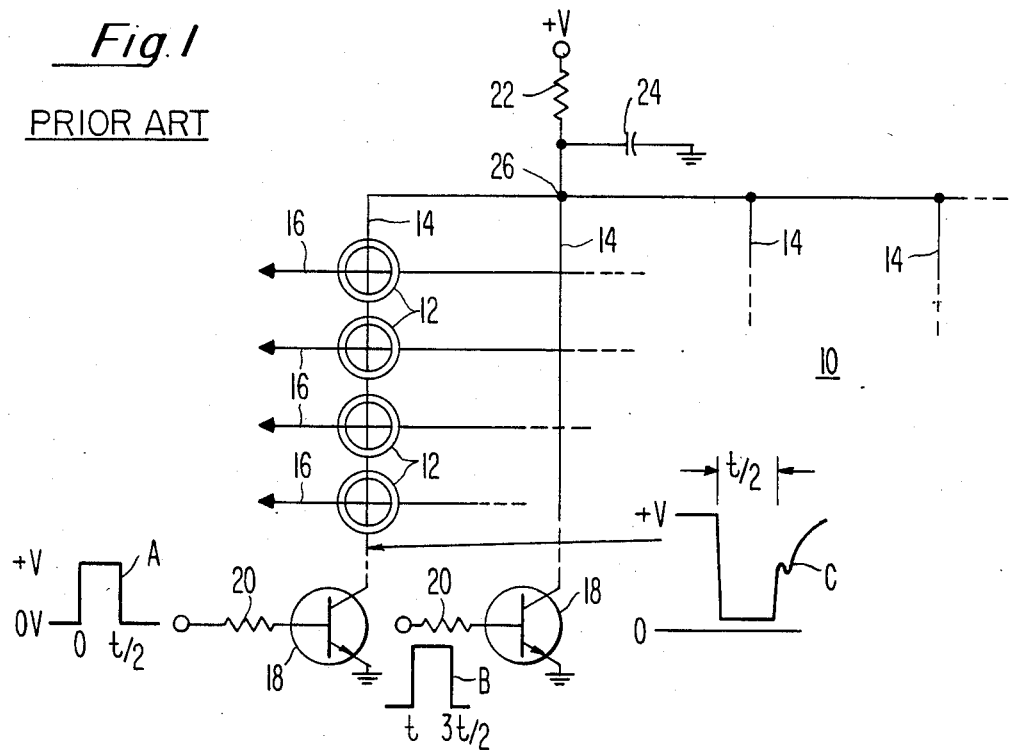
FIG. 1 a simplified circuit diagram of the prior art capacitor discharge scan circuit.

FIG. 1 is a simplified diagram of a saturable-core keyboard 10 utilizing the well-known capacitive-discharge scan circuit. The diagram is presented to identify the source of the electromagnetic interference which the circuits of the present invention, illustrated in FIGS. 2 and 3, effectively suppress.

With reference to FIG. 1, the toroidal magnetic cores 12, which may be of the miniature ferrite type, are organized into a matrix of scanned columns and sensed rows. The single turn scan windings for the individual cores are represented by lines 14; the single turn sense windings by lines 16. In operation, each of the scan lines 14 is scanned sequentially. A plurality of scan drive transistors 18 are associated respectively with the scan lines 14. The transistors 18 illustrated in FIG. 1 are of the NPN conductivity type. Each transistor 18 has its emitter electrode grounded and its collector electrode connected to an associated scan line 14. Successive positive pulses from a source thereof (not shown) and represented by square waveforms "A" and "B", occurring respectively at times "0" and "t" and having a pulse width equal to one-half of the period "t", are coupled via resistors 20 to the respective base electrodes of transistors 18. All of the scan lines 14 are connected in common to a capacitor-discharge circuit comprising a resistor 22 and a capacitor 24. Thus, resistor 22 is interposed between a source of positive supply voltage, +V, and the common point 26 of the scan lines 14; capacitor 24, between the last mentioned point and ground potential.

Assuming that the capacitor 24 has been charged during the interval between successive scan pulses, the occurrence of a scan pulse, such as "A", applied to transistor 18, causes the latter to conduct. Capacitor 24 discharges quite rapidly from a level substantially equal to that of the supply voltage, +V, toward ground potential as illustrated in waveform "C" appearing on the collector electrode of the conducting scan drive transistor 18. Be-cause of the high initial current, the discharge of capacitor 24 may take place in a few hundred nanoseconds. After the discharge, the current in scan line 14 falls to a relatively low steady-state value determined by resistor 22. On termination of the input pulse "A", the steady-state current falls abruptly to zero and as seen in waveform "C", the capacitor 24 recharges toward the supply voltage, +V. Initially, the charging voltage shows a slight oscillation due to the collapse of the core fluxes related to the steady-state current. While this effect is minor, it does represent a potential source of interference.

It is apparent that the voltage pulse present between the scan lines 14 and the chassis resembles a square wave which is inherently rich in the fundamental and lower order harmonics. Additionally, the sharp leading edge admits of considerable energy at higher order harmonics. The peak-to-peak amplitude of the last mentioned square wave is high since it approaches the magnitude of the supply voltage, +V. Under these conditions, the problem of electromagnetic emissions under normal circumstances is most acute.

Figure 2:
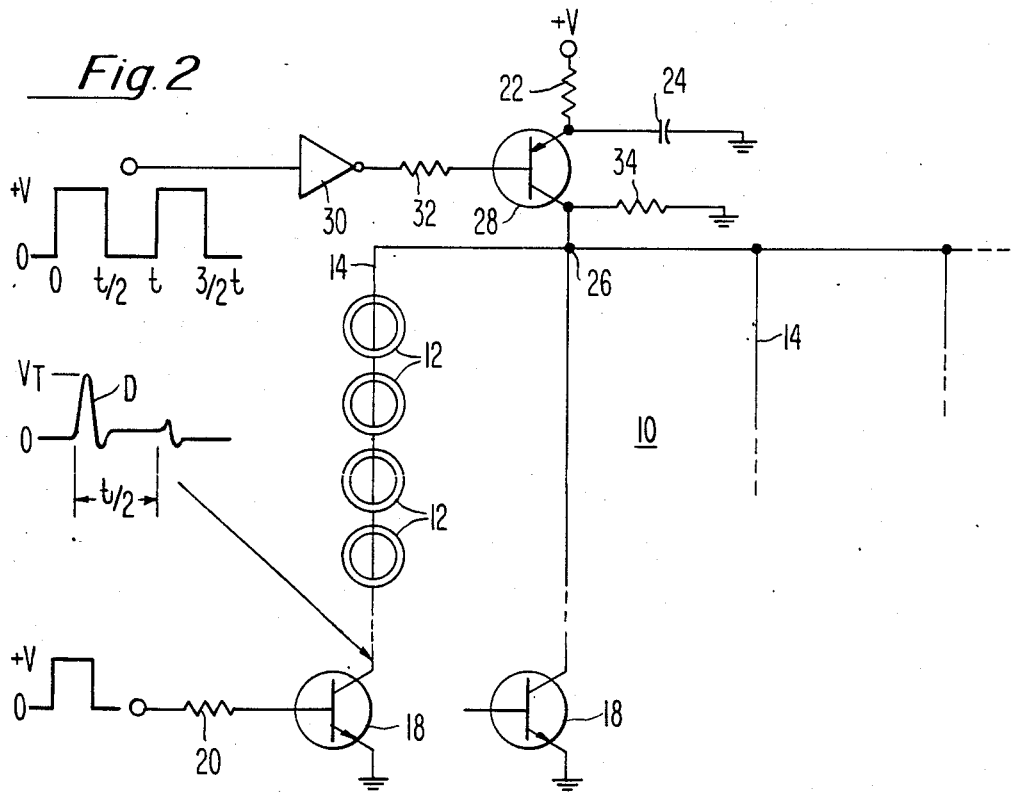
FIG. 2 a circuit diagram incorporating an additional stage to the circuit of FIG. 1 for interference suppression.

The circuit of FIG. 2, in accordance with the present invention, provides excellent attenuation of the external field, while retaining the simplicity and cost effectiveness of the scan drivers which are conveniently implemented by standard driver integrated circuits.

With reference to FIG. 2, a transistor 28 of the PNP type is interposed between the scan lines common point 26 and the RC charging circuit. More specifically, the emitter electrode of transistor 28 is connected to the junction of resistor 22 and capacitor 24, while the collector electrode is connected to the aforementioned common point 26. The pulse train, from which the successive pulses "A" and "B" applied to the scan drive transistor 18 are derived, is applied via a logical inverter 30 and resistor 32 to the base electrode of PNP transistor 28. An additional resistor 34 couples the collector of transistor 28 to ground. The purpose of resistor 34 is to prevent floating of the scan lines 14 during the off times between scans.

In operation, transistor 28 is driven to conduction in concurrence with the conduction of any of the NPN scan drive transistors 18. When the scan drive pulse terminates and the capacitor 24 recharge begins, the scan lines 14 are effectively disconnected from the capacitor 24 because the PNP transistor 28 cuts off simultaneously with the beginning of the recharge. Thus, as seen in waveform "D", the scan line 14 as seen at the collector of the active scan drive transistor 18 remains near ground potential except for the inductive transients at the beginning and end of the scan pulse. The magnitude, $V_T$, in waveform "D" of the positive excursion at the beginning of the scan pulse varies with the number of keys which have been depressed. Further, it should be observed that the charging of capacitor 24 to the supply voltage level, +V, does not affect the scan line potential.

In connection with the latter circuit performance, ideally, PNP transistor 28 should turn on slightly after the NPN scan drive transistor 18, in order to insure that the magnetic core string has a low impedance path to ground, thus minimizing the initial voltage swing. As a practical matter, in an actual operative system, the existence of one or more stages of integrated circuit logic in addition to those in the scan driver path is sufficient to provide the necessary margin. The turn-off sequence is less critical because the voltage rise is limited by the RC charging effect to a relatively low rate.

The resultant voltage waveform "D" at the collector of transistor 18 is limited to the collector saturation voltage, typically less than 0.5 volt at the current peak and approximately 100 millivolts when the steady-state condition is attained. The waveform on the collector of PNP transistor 28 exhibits the same pattern as that of "D"—a short, highly damped inductive spike of a few volts magnitude superimposed at the beginning, and a small oscillatory transient at the end when the steady-state current is interrupted.

With the exception of the last mentioned transient, the circuit of FIG. 2 limits voltage excursions of the keys to very nearly the minimum necessary to permit proper keyboard operation. Although the interference suppression realized in the circuit of FIG. 2 is adequate for many applications, a further reduction in interference is possible if the circuit is modified to reduce the steady-state current to zero, thereby eliminating the trailing-edge transient oscillation.

Figure 3:
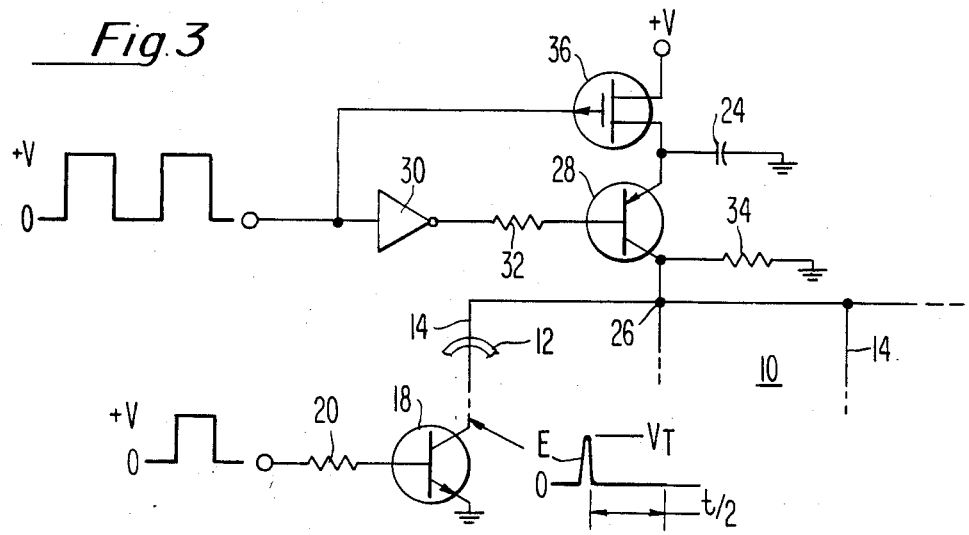
FIG. 3 is a circuit diagram incorporating a further additional stage to the circuit of FIG. 2 for increased interference suppression.

The circuit depicted in FIG. 3 performs the last mentioned function. Another transistor 36 is added to the circuit of FIG. 2. Thus, transistor 36, which is conveniently an enhancement mode P-channel MOS type, is interposed between the charging capacitor 24 and the supply, +V. Use of this type current conducting device, which has a relatively high "on" resistance, limits the charging current, thus eliminating the need for resistor 22 (FIG. 2). Also, an additional resistance component is saved because none is required in the gate electrode circuit of MOS transistor 36. Specifically, the source electrode of transistor 36 is coupled to the supply, +V and the drain electrode, to the common junction of the emitter of PNP transistor 28 and one of the pair of terminals of capacitor 24. The other terminal of capacitor 24 remains grounded.

In operation, the pulse train from which the sequential pulses "A" and "B" (FIG. 1) are derived is applied without change in polarity to MOS transistor 36. As in the circuit of FIG. 2, the PNP transistor 28 is driven simultaneously by inverted signals from the pulse train. Thus, the MOS transistor 36 is nonconducting when the scan drive transistor 18 is conducting, and vice versa. In this manner, the entire scan circuit is disconnected from the supply, +V, during the scan pulse period and since there is no steady-state current flow, the turn-off oscillatory transient voltage described in connection with FIG. 2 and shown in waveform "D" is eliminated. Waveform "E" present on the collector of NPN transistor 18 depicts this condition.

In the schematic diagrams of FIGS. 2 and 3, the operational drive pulses applied to the PNP transistor 28 and MOS transistor 36 are depicted as being derived from a pulse train in which successive pulses are applied to a plurality of scan drive transistors 18. In an actual keyboard, the last mentioned pulses may be derived and delivered to the appropriate scan drive transistors internally to the driver integrated circuit and may be inaccessible for the purpose of obtaining an inverted pulse train, as required to drive PNP transistor 28. This condition has been solved by the addition of an external circuit to obtain the required pulses.

It should be noted that the external circuit to accomplish the foregoing may take different forms depending upon the particular keyboard system employed. A well-known system for keyboard scanning uses a binary-coded decimal (BCD) to ten-line integrated circuit 38 to drive ten scan lines 14, and the "off" state is developed by the insertion of a forbidden code, that is, a hexidecimal number greater than nine, into the four-line input. This condition causes all scan outputs to be "off". It is thus necessary to sense the forbidden states in order to generate the drive signals for the suppression transistors 18 and 36.

Figure 4:
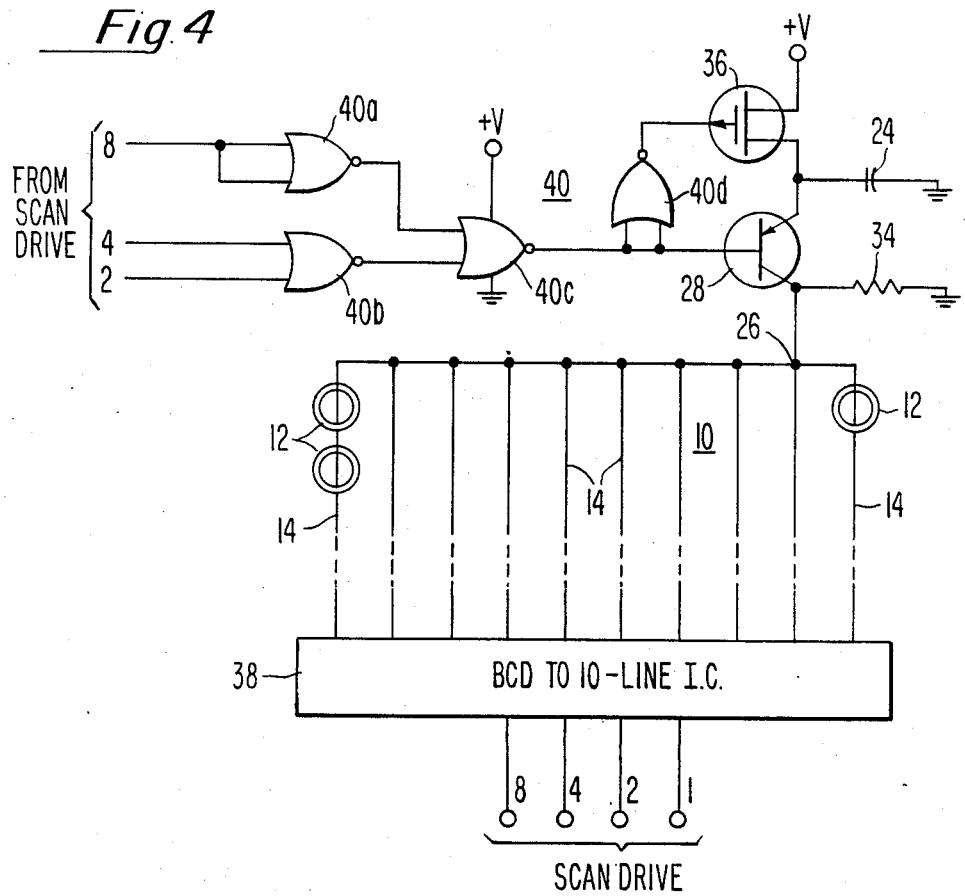
FIG. 4 is a circuit for providing operational signals to the EMI suppression stages of either FIGS. 2 or 3.

The circuit of FIG. 4 provides a simple and effective means for providing the required pulses. A standard CMOS quad NOR gate integrated circuit 40 is used to decode the hexidecimal input and to suppress the output for any code larger than nine, that is, when the most significant bit is "high" and either of the next two more significant bits is also "high". Both inverted and noninverted pulses are provided by the NOR gate logic. Therefore, the circuit is suited for both the circuits of FIGS. 2 and 3.

As an example of the operation of FIG. 4, it may be assumed that the No. 2 line is to be scanned. Thus, an appropriate binary signal is applied to the scan drive lines, labelled 8, 4, 2 and 1, coupled to the input terminals of the BCD-to-10 line integrated circuit 38. The ten scan lines 14, labelled 0 through 9, are coupled to the respective output terminals of the circuit 38. As in the circuits of FIGS. 1-3, inclusive, the opposite extremities of the scan lines are connected to a common point 26.

The CMOS quad NOR gate 40 is comprised of four NOR gates identified as 40a, 40b, 40c and 40d. Each of the NOR gates has a pair of input terminals and an output terminal. Signals from the scan drive are applied to lines 8, 4 and 2. Line 8 is coupled in common to the two input terminals of NOR gate 40a, while lines 4 and 2 are coupled respectively to the input terminals of NOR gate 40b. The respective output terminals of NOR gates 40a and 40b are coupled to the respective input terminals of NOR gate 40c. The output terminal of the last mentioned gate is coupled in common to the pair of input terminals of NOR gate 40d and to the base electrode of PNP transistor 28. The output of NOR gate 40d is coupled to the gate electrode of CMOS transistor 36.

In order to scan the line No. 2, the scan drive lines 8, 4 and 1 are "low", while line 2 is "high". Since the integrated circuit 38 includes drivers equivalent to the NPN scan drive transistors 18, the appropriate driver within the circuit associated with line 2 turns "on". In the CMOS quad gate area, lines 8 and 4 are "low"; 2, is "high". The outputs of NOR gates 40a and 40b are "high" and "low" respectively, while that at the output of NOR gate 40c is "low" as required to turn "on" PNP transistor 28. Also, the output of NOR gate 40d is "high", which when applied to the gate electrode of MOS transistor 36 turns this transistor "off". During the non-scan interval, the presence of high signals on lines 8 and on either 4 or 2 causes transistor 28 to be nonconducting; transistor 36, conducting.

The CMOS circuit 40 provides a number of advantages. Since the CMOS channel resistance limits the available drive current, the base resistor in the PNP stage 28 is superfluous and may be eliminated. Also, the full ground-to-supply (+V) output voltage swing of unloaded CMOS provides the necessary "on" and "off" gate voltages for the MOS transistor 36. The relatively long propagation delay and transition times for CMOS logic insures sufficient gating delay to allow the scan transistors 18 to turn "on" before the scan lines are energized, thus preventing any unnecessary initial transient voltages. Moreover the very low static drain of CMOS minimizes additional drain on the system power supply.

In an actual operative embodiment of the present invention, typical values for resistor 22 and capacitor 24 (FIG. 2) are 220 ohms and 0.01 microforads. The PNP suppression transistor (FIGS. 2 and 3) is a type 2N2907A and the MOS suppression transistor, 2N4352. The CMOS-quad NOR gate 40 (FIG. 4) is a type CD4001B. Resistor 34 (FIGS. 2-4) is 1K ohms. The supply voltage, +V, is 5 volts. It must be emphasized that the foregoing values and types have been provided solely for purposes of example and are not to be construed as limitative of the inventive circuits described herein.

In conclusion, the suppression circuits of the present invention effectively reduce electromagnetic interference to an acceptable level and obviate containment or shielding techniques. As applied to the keyboard systems, the present invention eliminates the conductive-membrane shielding of keys which is cumbersome, expensive, and ergonomically disadvantageous.

It should be understood that changes and modifications of the circuit organization presented herein may be needed to suit particular requirements. Such changes and modifications are well within the skill of the electronics circuit designer and insofar as they are not departures from the true scope and spirit of the invention are intended to be covered by the following claims.

What is claimed is:

1. A circuit for suppressing electromagnetic interference in saturable magnetic core-type keyboards having a plurality of cores associated with respective keys comprising:

at least one scan line, said scan line linking at least one of said cores, said scan line having a pair of extremities, a first drive transistor operatively coupled to one of said extremities of said scan line, scan pulse means for applying a scan pulse to said first drive transistor, said last mentioned transistor being driven to a conducting state in response to said scan pulse, such that the duration of said scan pulse establishes a scan period, a source of supply voltage, a capacitor charging circuit, means coupling said charging circuit to said source of supply voltage whereby said capacitor is charged during a nonscan period, a second transistor operatively coupled between said charging circuit and the other extremity of said scan line, inverter means operatively coupled between said scan pulse means and said second transistor for applying an inverted scan pulse to the last mentioned transistor, said inverted scan pulse causing the conduction of said second transistor in substantial concurrence with the conduction of said first drive transistor, thereby permitting said charging circuit to discharge in a current path which includes said scan line, said second transistor assuming a nonconducting state during said nonscan period, thereby effectively disconnecting said charging circuit from said scan line during the last mentioned period.

2. A circuit as defined in claim 1 wherein said first drive transistor is of the NPN conductivity type, said first drive transistor having an emitter, a collector and a base electrode, the emitter electrode of said first drive transistor being connected to ground potential and the collector electrode thereof being connected to said one of said extremities of said scan line, said scan pulse being coupled to the base electrode of said first drive transistor.

3. A circuit as defined in claim 2 wherein said second transistor is of the PNP conductivity type, said second transistor having an emitter, a collector, and a base electrode, the emitter electrode of said second transistor being coupled to said charging circuit and the collector electrode thereof being connected to said other of said extremities of said scan line, said inverted scan pulse being coupled to the base electrode of said second transistor.

4. A circuit as defined in claim 3 wherein said means coupling said capacitor charging circuit to said source of supply voltage is a resistor, said emitter electrode of said second transistor being connected to the junction of said resistor and the capacitor of said charging circuit.

5. A circuit as defined in claim 3 wherein said means coupling said charging circuit to said source of supply voltage includes a third transistor, said scan pulse means being coupled to said third transistor for applying a scan pulse thereto, said last mentioned transistor being caused to assume a nonconducting state in response to said scan pulse applied thereto during said scan period, whereby said current path which includes said scan line is effectively disconnected from said source of supply voltage during said last mentioned period.

6. A circuit as defined in claim 5 wherein said third transistor is of the P-channel enhancement mode MOS type, said third transistor having a source, a drain and a gate electrode, the source electrode of said third transistor being connected to said source of supply voltage and the drain electrode thereof being coupled to said charging circuit, said scan pulse being coupled to the gate electrode of said third transistor.

7. A circuit as defined in claim 6 characterized in that said charging circuit includes a capacitor having a pair of terminals, one of said capacitor terminals being connected to ground potential, the other of said capacitor terminals being connected in common to said emitter electrode of said second transistor and said drain electrode of said third transistor.

8. A circuit as defined in claim 7 wherein said scan pulse means includes a plurality of scan drive lines for receiving concurrent signals representative of a binary coded decimal, means for converting said last mentioned signals to a scan pulse for application to said first drive transistor, a plurality of NOR gates, each of said gates having a pair of input terminals and an output terminal, means coupling selected ones of said scan drive lines to the input terminals of predetermined ones of said NOR gates, the output terminals of a pair of said plurality of NOR gates being connected respectively to the base electrode of said second transistor and the gate electrode of said third transistor.

9. A circuit as defined in claim 8 characterized in that said cores are arranged in a matrix of rows and columns, a plurality of scan lines, each of said scan lines linking the cores in a column in series relation.

10. A circuit as defined in claim 9 further including a plurality of first drive transistors coupled respectively to said plurality of scan lines, said scan pulse means applying consecutive scan pulses respectively to said plurality of first drive transistors, whereby each of said plurality of scan lines is scanned in turn.

11. A circuit as defined in claim 9 wherein said plurality of scan lines are ten in number, said scan drive lines being four in number for receiving binary coded decimal signals of said means for converting said signals comprising a BCD-to-10 line converter such that each of said ten lines are selected in turn in response to said signals, said plurality of NOR gates being four in number, a first of said NOR gates having its pair of input terminals connected to the most significant bit of said binary coded signals, a second of said NOR gates having its pair of input terminals connected respectively to the next two most significant bits of said signals, a third of said NOR gates having its input terminals connected to the respective output terminals of said first and second NOR gates, a fourth NOR gate, the output terminal of said third NOR gate being connected in common to the base electrode of said second transistor and the pair of input terminals of said third NOR gate, the output terminal of said last mentioned NOR gate being connected to the gate electrode of said third transistor.

* * * * *